(12) United States Patent
Findeklee et al.

(10) Patent No.: US 7,973,531 B2
(45) Date of Patent: Jul. 5, 2011

(54) DETUNING A RADIO-FREQUENCY COIL

(75) Inventors: Christian Findeklee, Hamburg (DE); Daniel Wirtz, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 145 days.

(21) Appl. No.: 12/302,354

(22) PCT Filed: May 29, 2007

(86) PCT No.: PCT/IB2007/052006
§ 371 (c)(1),
(2), (4) Date: Nov. 25, 2008

(87) PCT Pub. No.: WO2007/138547
PCT Pub. Date: Dec. 6, 2007

(65) Prior Publication Data
US 2010/0060283 A1    Mar. 11, 2010

(30) Foreign Application Priority Data
May 30, 2006    (EP) ...................................... 06114694

(51) Int. Cl.
*G01V 3/00* (2006.01)
(52) U.S. Cl. ......................................... 324/318; 324/309
(58) Field of Classification Search .......... 324/300–322; 600/407–445
See application file for complete search history.

(56) References Cited

U.S. PATENT DOCUMENTS

| | | | |
|---|---|---|---|
| 2,530,928 A * | 11/1950 | Wild ......................... | 178/18.01 |
| 3,355,667 A * | 11/1967 | Bruene ....................... | 455/123 |
| 3,760,278 A * | 9/1973 | Narbaits-Jaureguy et al. ............................. | 455/523 |
| 4,682,125 A | 7/1987 | Harrison et al. | |
| 4,763,076 A | 8/1988 | Arakawa et al. | |
| 4,788,503 A * | 11/1988 | Van Heelsbergen .......... | 324/322 |
| 4,801,885 A | 1/1989 | Meissner et al. | |
| 4,835,472 A | 5/1989 | Zabel et al. | |
| 5,006,805 A | 4/1991 | Ingwersen | |
| 5,323,113 A * | 6/1994 | Cory et al. .................... | 324/318 |
| 5,928,145 A | 7/1999 | Ocali et al. | |
| 6,026,286 A * | 2/2000 | Long ............................ | 455/327 |
| 6,160,400 A | 12/2000 | Friedrich et al. | |
| 6,593,744 B2 * | 7/2003 | Burl et al. ..................... | 324/322 |

(Continued)

FOREIGN PATENT DOCUMENTS

EP    0317090 A2    5/1989

(Continued)

OTHER PUBLICATIONS

Chingas, G.C., et al.; Design Strategy for TEM High Field Resonators; 1996; Proc. 4th Annual Intl. Society of Magnetic Resonance in Medicine; pp. 1426.

(Continued)

*Primary Examiner* — Brij B Shrivastav

(57) ABSTRACT

For detuning of radio-frequency coils (in magnetic resonance imaging and spectroscopy, for example), a conducting element (102) of a transmission cable is configured to form a primary resonant circuit tunable to at least one first resonance frequency. A second conducting element (104) of the transmission cable is configured to form a switching circuit that is electrically insulated from and reactively coupled via inductive coupling and/or capacitive coupling to the primary resonant circuit, and is adapted to tune the primary resonant circuit to at least one second resonance frequency, thereby detuning the primary resonant circuit.

10 Claims, 5 Drawing Sheets

U.S. PATENT DOCUMENTS

Figure 1:
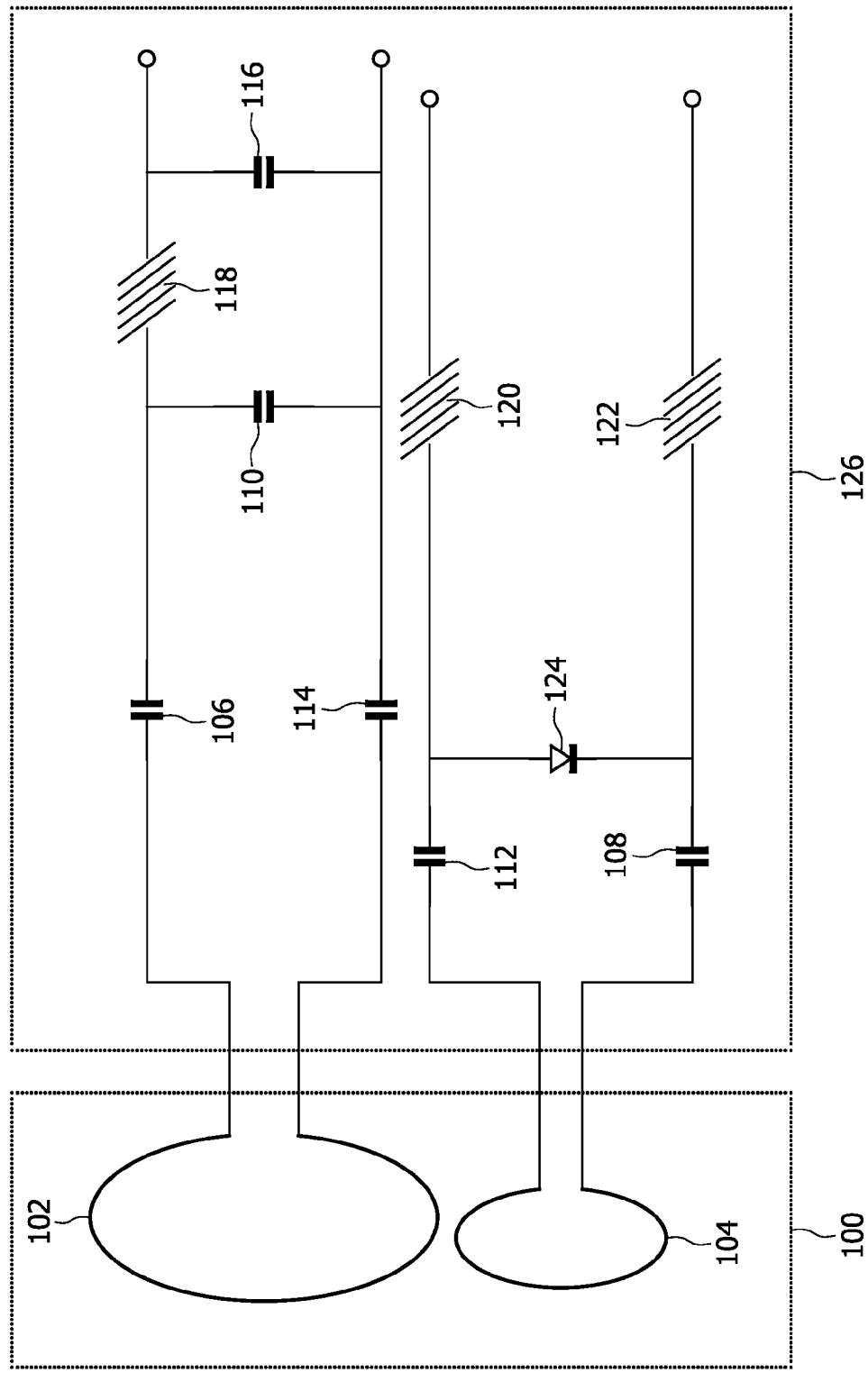

| | | | |
|---|---|---|---|
| 6,844,547 B2 * | 1/2005 | Syka | 250/292 |
| 6,847,210 B1 | 1/2005 | Eydelman et al. | |
| 6,953,619 B2 * | 10/2005 | Dean et al. | 428/297.4 |
| 7,023,209 B2 * | 4/2006 | Zhang et al. | 324/318 |
| 7,723,988 B2 * | 5/2010 | Schwilch et al. | 324/322 |
| 7,777,496 B2 * | 8/2010 | Evans et al. | 324/534 |
| 2002/0145427 A1 | 10/2002 | Wong et al. | |
| 2004/0217761 A1 | 11/2004 | Wong et al. | |

FOREIGN PATENT DOCUMENTS

| | | |
|---|---|---|
| EP | 0385367 A1 | 2/1990 |
| JP | 2003024294 A | 1/2003 |
| WO | 0231522 A1 | 4/2002 |
| WO | 02082115 A2 | 10/2002 |
| WO | 2006060706 A1 | 6/2006 |

OTHER PUBLICATIONS

Bogdanov, G., et al.; Coupled Microstrip Line Transverse Electromagnetic Resonator Model for High-Field Magnetic Resonance Imaging; 2002; MRM; 47:579-593.

Bergman, A. H., et al.; Actively decoupled HF transmission line surface coil; 1989; Soc. for Magnetic Resonance Imaging; vol. 2:957.

Smith, J., et al.; Active detuning of inductively coupled surface coils; 2005; Proc. Intl. Soc. Mag. Reson. Med.; 13:323.

* cited by examiner

DETUNING A RADIO-FREQUENCY COIL

This invention relates to magnetic resonance (MR) imaging and spectroscopy, and particularly to detuning of radio-frequency (RF) coils.

A device for detuning a cylindrical main RF coil of an MR system is discussed in a patent application by Varian Inc. (WO 02/082115 A2). However, their device is not easily adaptable to other configurations of RF coils, for example surface coils. Therefore, it is desirable to have a device capable of detuning various configurations of RF coils. It is also desirable to have a method of detuning an RF coil that is applicable to a larger variety of RF coil configurations, as well as to have a magnetic resonance system that utilizes such a detuning device.

Accordingly, a switching circuit capable of tuning RF coils of various configurations, a method of tuning an RF coil using such a switching circuit, and an MR system comprising an RF coil including such a switching circuit are disclosed herein. A first conducting element of a transmission cable is configured to form a primary resonant circuit tunable to at least one first resonance frequency. A second conducting element of the transmission cable is configured to form a switching circuit that is electrically insulated from and reactively coupled to the primary resonant circuit. The term "reactively coupled" or "reactive coupling" indicates inductive coupling, capacitive coupling or a combination of the two. The switching circuit is adapted to tune the primary resonant circuit to at least one second resonance frequency, which is different from the first resonance frequency.

The corresponding method disclosed herein comprises configuring a first conducting element of the transmission cable to form a primary resonant circuit tunable to at least one first resonance frequency, configuring a second conducting element of the transmission cable to form a switching circuit that is electrically insulated from and reactively coupled to the primary resonant circuit, and adapting the switching circuit to tune the primary resonant circuit to at least one second resonance frequency.

Operating the switching circuit results in shifting the resonance frequencies, say one or more first resonance frequencies, of the primary resonant circuit, by tuning the primary resonant circuit to at least one second resonance frequency which is different from the primary resonance frequencies. Thus, when operated, the switching circuit detunes the primary resonant circuit. As both the switching circuit and the primary resonant circuit are formed from the same transmission cable, it becomes possible to have a detuning circuit capable of detuning a larger variety of RF coil configurations.

Figure 2:
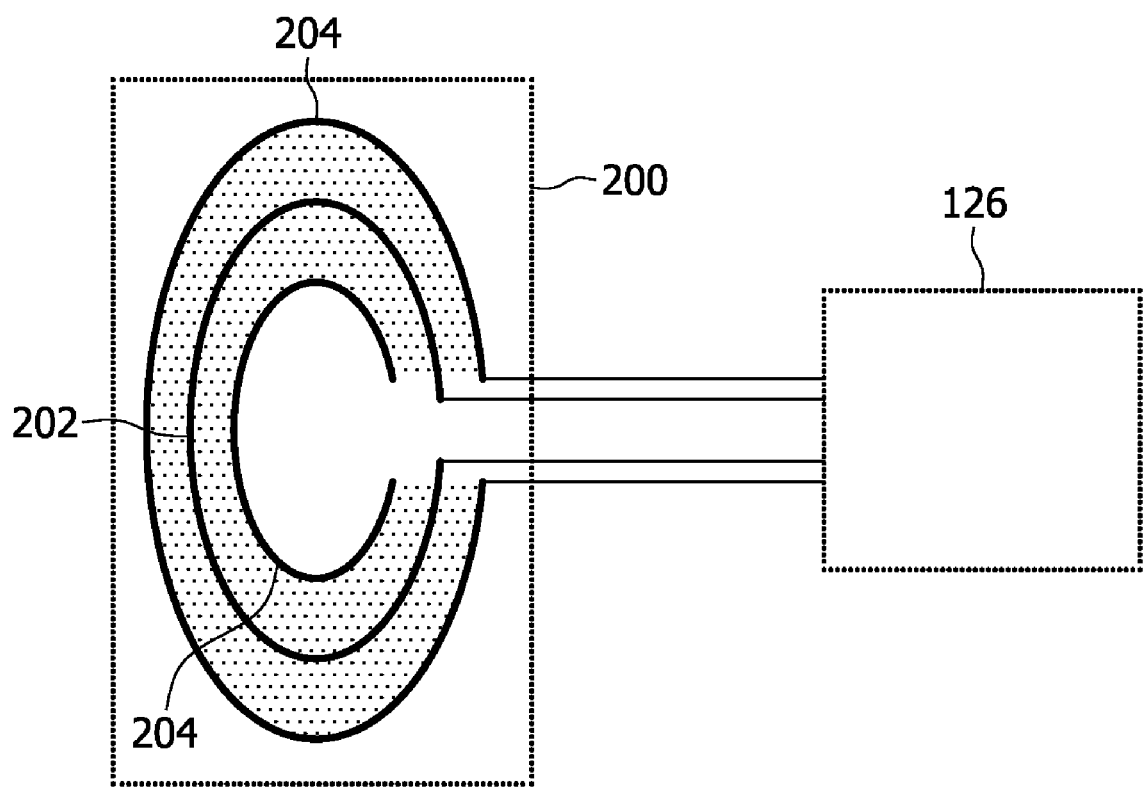
Figure 3:
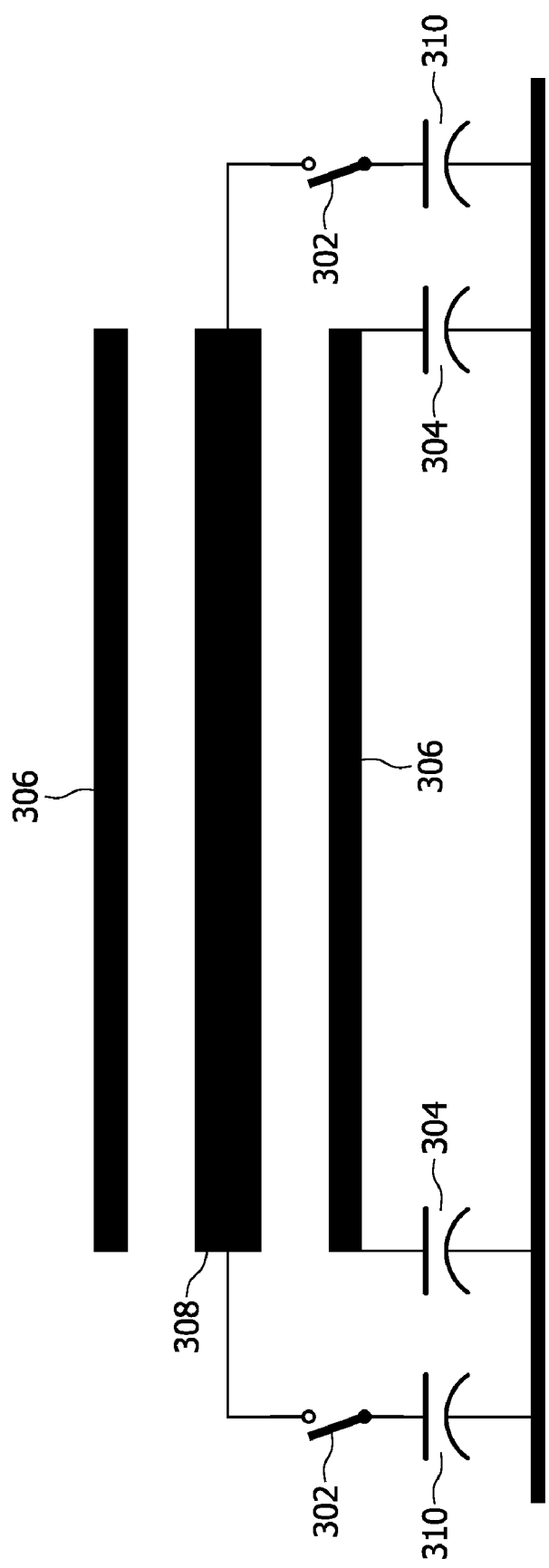
Figure 4:
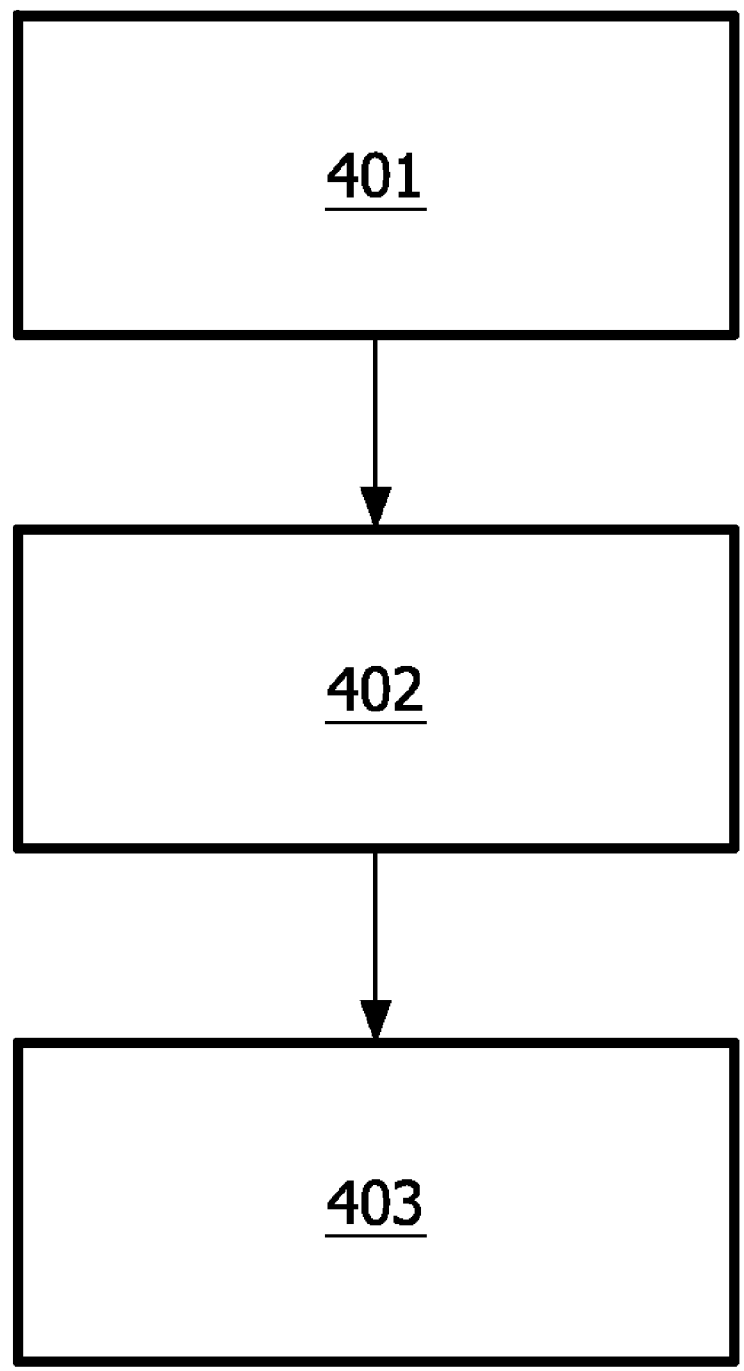

These and other aspects will be described in detail hereinafter, by way of example, on the basis of the following embodiments, with reference to the accompanying drawings, wherein:

FIG. 1 schematically shows an embodiment of the disclosed tunable RF coil;

FIG. 2 schematically shows a second embodiment of the disclosed tunable RF coil;

FIG. 3 schematically shows a third embodiment of the disclosed tunable RF coil;

FIG. 4 illustrates a method of tuning a primary resonant circuit; and

Figure 5:
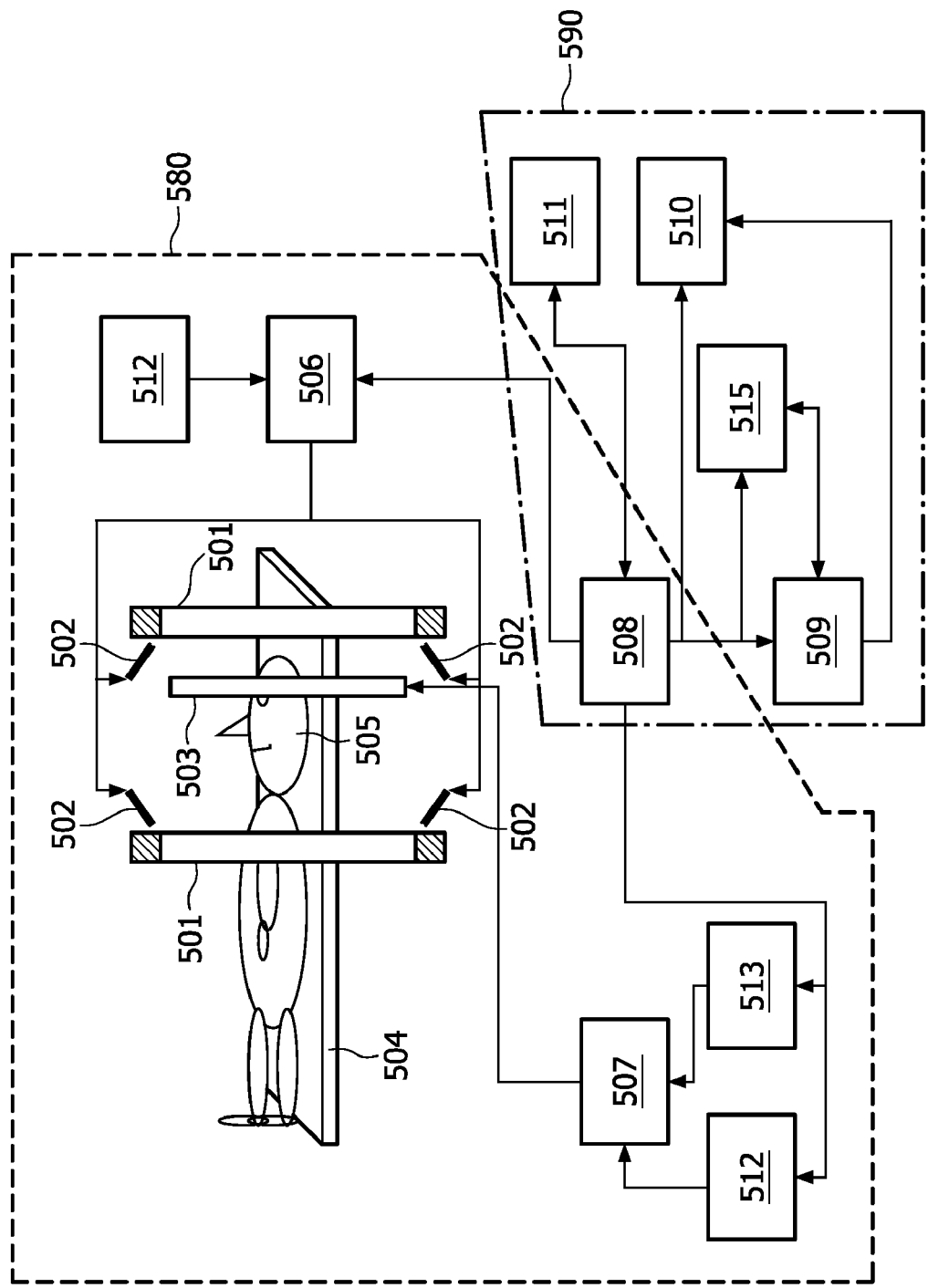

FIG. 5 schematically shows a magnetic resonance system that utilizes an embodiment of the disclosed tunable RF coil.

Corresponding reference numerals used in the various figures represent corresponding elements in the figures.

FIG. 1 illustrates one possible embodiment of a tunable RF circuit assembly. A transmission cable 100 comprises two conducting elements 102, 104 that are insulated from each other. The first conducting element 104 forms part of an RF receiver coil 100 that is tuned to at least one first resonance frequency, and connected to a matching network, using capacitors 106, 110, 114, 116, and an inductor 118. Other circuit configurations or topologies may also be used for tuning and matching the RF receiver coil. The second conducting element 102 is connected in series to capacitors 108, 112, and inductors 120, 122, and in parallel to a pin diode 124. The portions of the tuning and the switching circuits that include lumped electrical elements like capacitors and inductors is shown by the box 126.

Detuning of an RF coil refers to the practice of shifting the resonance frequency of a primary resonant circuit to one or more other frequencies different from the original resonance frequency. An RF receiver coil is commonly detuned when an RF transmitter coil is active or operational, i.e., when the system is transmitting RF excitation pulses to a subject under examination. The RF transmitter coil may also be detuned when the RF receiver coil is operational, i.e., when the RF receiver coil is receiving MR signals from the subject under examination. Conventionally, RF coils are detuned using diodes that are connected to the primary resonant circuit, also known as the resonator.

In principle, there are two ways to establish detuning. The first way is to put a diode in series with the resonator. When the diode is forward biased, the coil is switched on, which allows RF currents to flow through the coil, while in the reverse-biased mode, the diode forms a high impedance, thereby opening the resonator electrically. In this design, additional losses caused by the equivalent series resistance of the diode, the extra solder points, etc., directly affect the resonator circuit. The diode also produces additional non-thermal noise or shot noise, which may further decrease signal-to-noise ratio (SNR) available with the coil. The second way to detune an RF coil is to use a parallel resonant circuit in series to the resonator, where the parallel resonant circuit is again switched with a diode. In this case, the diode is reverse-biased in order to switch the resonator to operational mode. However, in this case also, the additional components cause losses in the coil. In particular, the second alternative needs an additional inductor, which may distort the $B_1$ field distribution of the primary resonant circuit. The additional inductor is often of low quality on account of its size. Further, the parallel resonant circuit has to be qualitatively comparable to the resonator, which is not easy to achieve for high-Q coils.

In the two ways of detuning mentioned above, the RF receiver circuit and the detuning circuit are electrically connected. In contrast, for the kind of detuning circuit disclosed herein, the RF receiver and the detuning circuits are separated, with no direct electrical interconnection between the two. Instead, the proposed device uses a strong reactive coupling between the two circuits to effect the detuning of the RF receiver circuit. This obviates the need to put additional lumped electrical elements or solder points directly in the RF receiver circuit, thereby reducing losses in the circuit.

The losses in an RF receiver coil can become more significant in cases where the coil size is comparable to the distance between the coil and the subject. Such losses in the RF receiver coil will significantly affect the signal-to-noise ratio of the coil. The disclosed detuning method describes a way of detuning such RF receiver coils very efficiently with low effort and, most importantly, with very low additional losses in the coil. An efficient way of implementing the disclosed method is to use a transmission cable with multiple conductors to fabricate the resonant circuit as well as the detuning or switching circuit. The transmission cable forming the RF receiver coil may also be configured as a wave guide at the resonant frequency, by fixing the length of the transmission cable equal to one-quarter of the wavelength of the received MR signal.

With reference to FIG. 1, one conductor 102 of the transmission cable forming the RF receive coil 100 is connected to a matching network, and to a pre-amplifier following the matching network. The other conductor 104 forming the RF coil 100 is connected to a switching circuit which is formed by a diode 124 connected in parallel, together with capacitors and inductors, as shown in FIG. 1. The RF coil 100 is tuned to a desired frequency, for example 64 MHz, which is the proton resonance frequency at 1.5 T. Of course, the RF coil 100 may be tuned to any other suitable frequency, depending on the nuclear species being studied, the field strength of the main magnetic field, etc. Alternatively, the RF coil may be made multi-resonant by tuning it simultaneously to multiple frequencies, methods for which are known in the art.

The diode 124 functioning as a switch may be a PIN diode. When the diode 124 is reverse-biased, it represents a high resistance, typically >100 kilo Ohm. Under this condition, there will be almost no current flowing in the conductor 104, and thus there will be no change in the resonance frequencies of the RF coil. In this state, the RF coil 100 is in "operating" mode, which may be a "transmit" mode and/or a "receive" mode. Applying a forward bias to diode 124 makes it conducting, which allows currents to flow in the conductor 104. The reactive coupling between the conductors 102, 104 has the effect of shifting the resonance of the coil 100 to a different frequency. Alternatively, depending on the choice of capacitors 108, 112, the resonance frequency may be split into two or more frequencies, thereby reducing the sensitivity of the RF coil at the original resonance frequency. In either case, the RF coil 100 is no longer operative at the frequency it was previously tuned to; in effect, the resonant coil 100 has been detuned.

Alternatively, the PIN diode 124 may be forward-biased during normal operation of the RF coil 100. Thus the RF coil 100 is tuned to a desired frequency when there is a current flowing in the conductor 104. When the PIN diode 124 is reverse-biased, the current flowing in the conductor 104 drops almost to zero, which changes the reactive coupling between the two conductors 102, 104. This would have the effect of reducing the sensitivity of the RF coil at the original resonance frequency, thereby detuning the RF coil 100.

The tuning and switching circuits outlined by box 126 are shown separated from the receiving coil 100 only for illustrative purposes. In reality, the tuning and switching circuits 126 could be formed from the same transmission cable used to form the RF receiver coil 100, with additional lumped elements connected as shown in FIG. 1. A transmission cable comprising more than two conductors may be used, wherein one conductor is used to form the switching circuit, and the rest of the conductors may be connected so as to form separate resonant circuits, each tuned to a different resonance frequency. By operating the switching circuits, it is possible to simultaneously detune all the resonant coils.

The conductor 104 forming part of the switching circuit is shown within the box 100 as a complete, unbroken conductor only for illustrative purposes. It is possible to implement the switching circuit even if the conductor is broken or otherwise incomplete. Under such circumstances, the switching circuit will couple predominantly capacitively to the resonant circuit. The lengths of the two conductors 102, 104 need not be identical, as long as the two conductors couple reactively to each other. When the conductors forming the RF coil are relatively short and unbroken, the coupling between them is predominantly inductive in nature. When the length of the conductors becomes, for example 10% of the wave length of the received MR signal, the coupling between the resonant and the switching circuits becomes more capacitive in nature.

FIG. 2 shows one possible embodiment of the disclosed detuning circuit, wherein the transmission cable is a coaxial cable. The coaxial cable is made up of at least one inner core conductor 202 surrounded by a sheath or shield conductor 204. The two conductors are electrically insulated from each other, and together form an RF receiver coil 200. The coaxial cable is connected to the tuning, matching and detuning circuits 126 shown in FIG. 1.

Either the inner or the outer conductor 202, 204 of the coaxial cable may be configured to form a primary resonant circuit by connecting a resonance capacitance as shown in FIG. 1. The outer conductor 204 has fewer losses compared to the inner conductor 202 and may therefore be used to form the primary resonant circuit. The inner and the outer conductors 202, 204 are now coupled reactively. The inner conductor 202 is connected to form part of a switching circuit, also as shown in FIG. 1. In addition to being made part of the switching circuit, it is also possible to configure the inner conductor 202 to form a secondary resonant circuit, which could improve detuning performance. The secondary resonant circuit may be tuned to the same resonance frequency as the primary resonant circuit, or to a different frequency. The secondary resonant circuit (as well as the primary resonant circuit) may even be tuned to multiple frequencies. In case the primary and the secondary resonant circuits are tuned to different resonant frequencies, it is possible to shift both resonance frequencies of the RF coil assembly 200, by adjusting the capacitor in the secondary resonant circuit. This may be useful for multi-nuclear applications, where signals from more than one nuclear species are observed using the same RF coil 200.

In addition to being applicable to receiver coils for MRI, the disclosed coil assembly is also applicable to transmit coils as well. FIG. 3 shows one possible embodiment of the disclosed detuning device applied to a transverse electromagnetic (TEM) transmit/receive coil. A transmission cable comprises an outer conductor 306 that is connected in series to capacitors 304 to form a first resonant circuit tuned to a particular resonance frequency. An inner conductor 308 is connected to at least one switching device 302 to form a switching circuit. The inner conductor 308 may also be connected to series capacitors 310 to form a secondary resonant circuit. Though the outer and inner conductors are shown as being coaxial in FIG. 3, other configurations such as parallel conductors is also possible.

The TEM resonator typically consists of a hollow cylinder made of a conducting material, with two circular endplates also made of a conducting material. The hollow cylinder encompasses a cylindrical cavity or bore, and at least one endplate has a circular aperture that permits access to the cylindrical bore. A number of struts or rungs run the length of the cylinder inside the shield, physically connecting the two endplates. The struts are typically 8, 16 or 24 in number, though it is possible to have other numbers as well. Generally, the number of rungs is chosen to be divisible by 4 so as to support quadrature feeding. The struts, together with the conducting cylinder and endplates, create a coaxial transmission line, with the struts and the conducting cylinder acting as the inner and the outer conductors, respectively. Additionally, some of the struts may be made up of an inner and an outer conductor separated by an insulating dielectric sleeve, which would enable them to act as coaxial lines with the inner and outer struts forming the inner and the outer conductors, respectively. In a particular implementation shown in FIG. 3, the struts are made of coaxial cable elements, with the center conductor of the coaxial cable (308) forming the inner strut and the outer conductor or sheath of the coaxial cable (306) forming the outer strut. Additional information about TEM resonators may be found in [G. Bogdanov, R. Ludwig, "Coupled microstrip line transverse electromagnetic resonator model for high-field magnetic resonance imaging", Magnetic Resonance in Medicine, Volume 47, Issue 3, Pages 579-593], and in [Chingas G C, Zhang N, "Design strategy for TEM high field resonators", pp 1426 of the Proceedings of the 4$^{th}$ Annual Meeting of the International Society of Magnetic Resonance in Medicine, New York, 1996].

FIG. 4 illustrates a method of providing a detuning circuit for an RF receiver coil, comprising configuring a first conducting element 401 of the transmission cable to form a primary resonant circuit tunable to at least one first resonance frequency, configuring a second conducting element 402 of the transmission cable to form a switching circuit electrically insulated from and reactively coupled to the primary resonant circuit, and adapting the switching circuit 403 to tune the primary resonant circuit to at least one second resonance frequency.

FIG. 5 shows a possible embodiment of an MR system utilizing the disclosed detuning circuit. The MR system comprises an image acquisition system 580, and an image processing and display system 590. The image acquisition system 580 comprises a set of main coils 501, multiple gradient coils 502 connected to a gradient driver unit 506, and RF coils 503 connected to an RF coil driver unit 507. The function of the RF coils 503, which may be integrated into the magnet in the form of a body coil, and/or may be separate surface coils, might further be controlled by one or more transmit/receive (T/R) switches 513. The multiple gradient coils 502 and the RF coils 503 are powered by a power supply unit 512. A transport system 504, for example a patient table, is used to position a subject 505, for example a patient, within the MR imaging system. A control unit 508 controls the RF coils 503 and the gradient coils 502. The image reconstruction and display system 590 comprises the control unit 508 that further controls the operation of a reconstruction unit 509. The control unit 508 also controls a display unit 510, for example a monitor screen or a projector, a data storage unit 515, and a user input interface unit 511, for example, a keyboard, a mouse, a trackball, etc.

The main coils 501 generate a steady and uniform static magnetic field, for example, of field strength 1.5 T or 3 T. The disclosed methods are applicable to other field strengths as well. The main coils 501 are arranged in such a way that they typically enclose a tunnel-shaped examination space, into which the subject 505 may be introduced. Another common configuration comprises opposing pole faces with an air gap in between them into which the subject 505 may be introduced by using the transport system 504. To enable MR imaging, temporally variable magnetic field gradients superimposed on the static magnetic field are generated by the multiple gradient coils 502 in response to currents supplied by the gradient driver unit 506. The power supply unit 512, fitted with electronic gradient amplification circuits, supplies currents to the multiple gradient coils 502, as a result of which gradient pulses (also called gradient pulse waveforms) are generated. The control unit 508 controls the characteristics of the currents, notably their strengths, durations and directions, flowing through the gradient coils to create the appropriate gradient waveforms. The RF coils 503 generate RF excitation pulses in the subject 505 and receive MR signals generated by the subject 505 in response to the RF excitation pulses. The RF coil driver unit 507 supplies current to the RF coil 503 to transmit the RF excitation pulses, and amplifies the MR signals received by the RF coil 503. The transmitting and receiving functions of the RF coil 503 or set of RF coils are controlled by the control unit 508 via the T/R switch 513. The T/R switch 513 is provided with electronic circuitry that switches the RF coil 503 between transmit and receive modes, and protects the RF coil 503 and other associated electronic circuitry against breakthrough or other overloads, etc. The characteristics of the transmitted RF excitation pulses, notably their strength and duration, are controlled by the control unit 508.

It is to be noted that though the transmitting and receiving coil are shown as one unit in this embodiment, it is also possible to have separate coils for transmission and reception, respectively. It is further possible to have multiple RF coils 503 for transmitting or receiving or both. The RF coils 503 may be integrated into the magnet in the form of a body coil, or may be separate surface coils. They may have different geometries, for example, a birdcage configuration or a simple loop configuration, etc. The control unit 508 is preferably in the form of a computer that includes a processor, for example a microprocessor. The control unit 508 controls, via the T/R switch 513, the application of RF pulse excitations and the reception of MR signals comprising echoes, free induction decays, etc. User input interface devices 511 like a keyboard, mouse, touch-sensitive screen, trackball, etc., enable an operator to interact with the MR system.

The MR signal received with the RF coils 503 contains the actual information concerning the local spin densities in a region of interest of the subject 505 being imaged. The received signals are reconstructed by the reconstruction unit 509, and displayed on the display unit 510 as an MR image or an MR spectrum. It is alternatively possible to store the signal from the reconstruction unit 509 in a storage unit 515, while awaiting further processing. The reconstruction unit 509 is constructed advantageously as a digital image-processing unit that is programmed to derive the MR signals received from the RF coils 503.

The order in the described embodiments of the disclosed methods is not mandatory. A person skilled in the art may change the order of steps or perform steps concurrently using threading models, multi-processor systems or multiple processes without departing from the disclosed concepts.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A tunable radio-frequency coil including a transmission cable, comprising:
    a first conducting element of the transmission cable configured to form a primary resonant circuit tunable to at least one first resonance frequency; and a second conducting element of the transmission cable configured to form a switching circuit electrically insulated from and reactively coupled to the primary resonant circuit, the switching circuit being adapted to tune the primary resonant circuit to at least one second resonance frequency.

2. The tunable radio-frequency coil of claim 1, wherein the transmission cable is configured as a waveguide at a particular resonance frequency.

3. The tunable radio-frequency coil of claim 1, the transmission cable comprising more than two conducting elements, wherein each conducting element additional to the first and the second conducting elements is configured to form an independent resonant circuit tuned to a respective resonance frequency.

4. The tunable radio-frequency coil of claim 1, wherein the transmission cable is a coaxial cable.

5. The tunable radio-frequency coil of claim 4, wherein the first conducting element is an outer shield of the coaxial cable, and the second conducting element is an inner core of the coaxial cable.

6. The tunable radio-frequency coil of claim 1, wherein the switching circuit is also configured to form a secondary resonant circuit tunable to at least a third resonance frequency.

7. The tunable radio-frequency coil of claim 1, wherein the transmission cable forms at least a portion of a transverse electromagnetic (TEM) coil.

8. A method of fabricating a radio-frequency coil including a transmission cable, comprising:
    configuring a first conducting element of the transmission cable to form a primary resonant circuit tunable to at least one first resonance frequency;
    configuring a second conducting element of the transmission cable to form a switching circuit electrically insulated from and reactively coupled to the primary resonant circuit; and
    adapting the switching circuit to tune the primary resonant circuit to at least one second resonance frequency.

9. A method of tuning a tunable radio-frequency coil including a transmission cable, wherein a primary resonant circuit comprising a first conducting element of the transmission cable is tuned to at least one first resonance frequency, the method comprising:
    operating a switching circuit comprising a second conducting element of the transmission cable, the switching circuit being electrically insulated from and reactively coupled to the primary resonant circuit; and
    tuning the primary resonant circuit to at least one second resonance frequency.

10. A magnetic resonance system comprising a tunable radio-frequency coil including a transmission cable, the tunable radio-frequency coil comprising:
    a first conducting element of the transmission cable configured to form a primary resonant circuit tunable to at least one first resonance frequency; and
    a second conducting element of the transmission cable configured to form a switching circuit electrically insulated from and reactively coupled to the primary resonant circuit, the switching circuit being adapted to tune the primary resonant circuit to at least one second resonance frequency.

* * * * *